(12) United States Patent
Huang

(10) Patent No.: US 11,506,807 B2
(45) Date of Patent: Nov. 22, 2022

(54) METHODS AND SYSTEMS FOR SIMULATION GRIDDING WITH PARTIAL FAULTS

(71) Applicant: ExxonMobil Upstream Research Company, Spring, TX (US)

(72) Inventor: Hao Huang, The Woodlands, TX (US)

(73) Assignee: ExxonMobil Upstream Research Company, Spring, TX (US)

( * ) Notice: Subject to any disclaimer, the term of this patent is extended or adjusted under 35 U.S.C. 154(b) by 612 days.

(21) Appl. No.: 16/389,054

(22) Filed: Apr. 19, 2019

(65) Prior Publication Data

US 2019/0392093 A1   Dec. 26, 2019

Related U.S. Application Data

(60) Provisional application No. 62/688,553, filed on Jun. 22, 2018, provisional application No. 62/752,624, (Continued)

(51) Int. Cl.
| | |
|---|---|
| *G06F 30/20* | (2020.01) |
| *G01V 1/30* | (2006.01) |
| *G01V 1/28* | (2006.01) |
| *G01V 1/34* | (2006.01) |
| *G01V 99/00* | (2009.01) |

(Continued)

(52) U.S. Cl.
CPC ............. *G01V 1/302* (2013.01); *G01V 1/282* (2013.01); *G01V 1/345* (2013.01); *G01V 99/005* (2013.01); *G06F 30/20* (2020.01); *G06T 17/05* (2013.01); *G06T 17/20* (2013.01); *G01V 2210/642* (2013.01); *G01V 2210/643* (2013.01)

(58) Field of Classification Search
CPC ........ G01V 1/302; G01V 1/345; G01V 1/282; G01V 99/005; G06T 17/05; G06T 17/20; G06F 30/20
USPC ........................................................ 703/9, 10
See application file for complete search history.

(56) References Cited

U.S. PATENT DOCUMENTS

| | | | | |
|---|---|---|---|---|
| 6,014,343 A | * | 1/2000 | Graf .......................... | G01V 1/28 367/73 |
| 9,053,570 B1 | | 6/2015 | Mallet et al. | |

(Continued)

OTHER PUBLICATIONS

U.S. Appl. No. 62/688,553, filed Jun. 22, 2018, Lin et al.

(Continued)

*Primary Examiner* — Andre Pierre Louis
(74) *Attorney, Agent, or Firm* — ExxonMobil Upstream Research Company

(57) ABSTRACT

Geologic modeling methods and systems disclosed herein employ an improved simulation meshing technique. One or more illustrative geologic modeling methods may comprise: obtaining a geologic model representing a faulted subsurface region in physical space; providing a set of background cells that encompass one or more partial faults within the subsurface region; defining a pseudo-extension from each unterminated edge of said one or more partial faults to a boundary of a corresponding background cell in said set; using the pseudo-extensions and the background cell boundaries to partition the subsurface region into sub-regions; deriving a simulation mesh in each sub-region based on the horizons in each sub-region; and outputting the simulation mesh.

20 Claims, 6 Drawing Sheets

Related U.S. Application Data filed on Oct. 30, 2018, provisional application No. 62/752,637, filed on Oct. 30, 2018.

(51) Int. Cl.
*G06T 17/05* (2011.01)
*G06T 17/20* (2006.01)

(56) References Cited

U.S. PATENT DOCUMENTS

| | | | |
|---|---|---|---|
| 9,395,466 | B1 | 7/2016 | Mallet et al. |
| 9,536,022 | B1 | 1/2017 | Tertois et al. |
| 9,652,889 | B2 | 5/2017 | Young et al. |
| 10,107,938 | B2 | 10/2018 | Huang et al. |
| 2011/0115787 | A1 | 5/2011 | Kadlec |
| 2012/0022837 | A1 | 1/2012 | Asbury et al. |
| 2012/0265510 | A1* | 10/2012 | Lepage ............ G01V 99/005 703/9 |
| 2013/0246031 | A1 | 9/2013 | Wu et al. |
| 2015/0066460 | A1* | 3/2015 | Klinger ............ G01V 99/005 703/2 |
| 2015/0316683 | A1 | 11/2015 | Purves et al. |
| 2016/0124117 | A1* | 5/2016 | Huang ............ G06T 17/05 703/2 |
| 2018/0031719 | A1 | 2/2018 | Huang et al. |
| 2018/0348401 | A1 | 12/2018 | Imhof et al. |

OTHER PUBLICATIONS

U.S. Appl. No. 62/752,624, filed Oct. 30, 2018, Huang.
U.S. Appl. No. 62/752,637, filed Oct. 30, 2018, Huang.
Branets, et al. (2015) "Capturing Geologic Complexity in a Simulation Grid", SPE-173270-MS, SPE Reservation Simulation Symposium, Houston, Feb. 2015.
Natali, M. et al. (2012) "Rapid Visualization of Geological Concepts", 2012 25$^{th}$ SIBGRAPI Conference on Graphics, Patterns and Images, Aug. 22-25, 2012, pp. 150-157.
Natali, M. et al. (2013) "Modeling Terrains and Subsurface Geology" in EuroGraphics 2013 State of the Art Reports (STARs), 2013, pp. 155-173.
Duan, P. et al. (2014) "DEM Reconstruction Based on Adaptive Local RBF", in The Open Civil Engineering Journal, Jul. 31, 2014, vol. 8, pp. 232-236.
Nguyen et al. (2014) "A Complete Method for Reconstructing an Elevation Surface of 3D Point Clouds", in REV Journal On Electronics and Communications, vol. 4, No. 3-4, Jul.-Dec. 2014, pp. 91-97.

* cited by examiner

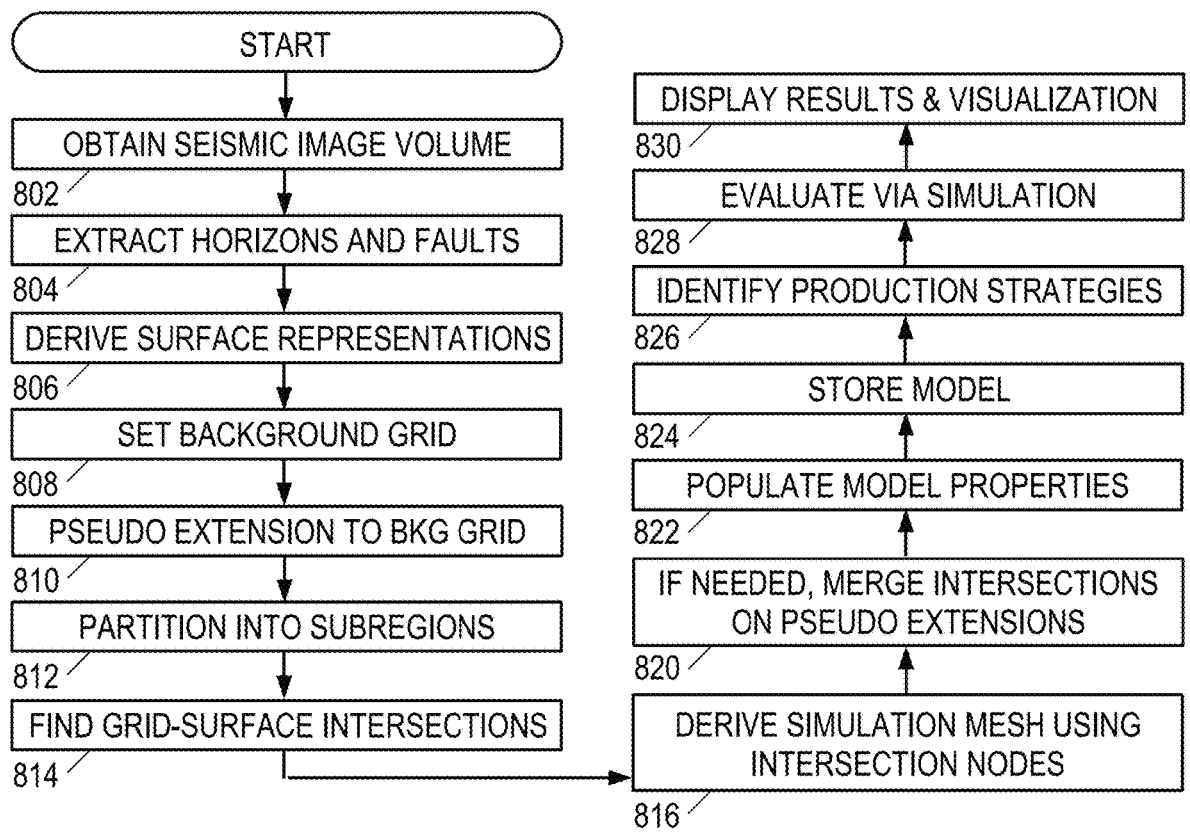

METHODS AND SYSTEMS FOR SIMULATION GRIDDING WITH PARTIAL FAULTS

CROSS-REFERENCE TO RELATED APPLICATION

This application claims the benefit of (i) U.S. Provisional Application No. 62/688,553 entitled "Methods and Systems for Modeling Subsurfaces Containing Partial Faults" that was filed Jun. 22, 2018; (ii) U.S. Provisional Application No. 62/752,624 entitled "Method and System for Generating Simulation Grids by Mapping a Grid from the Design Space" that was filed Oct. 30, 2018; and (iii) U.S. Provisional Application No. 62/752,637 entitled "Methods and Systems for Simulation Gridding with Partial Faults" that was filed on Oct. 30, 2018; the disclosures of which are incorporated herein by reference.

TECHNICAL FIELD

The present application relates generally to the field of hydrocarbon exploration, development, and production and, more particularly, to geologic modeling and reservoir simulation. Specifically, the disclosure relates to methods and systems for deriving, from a subsurface model, a volumetric grid for reservoir simulation. The simulation grid may be used in various hydrocarbon operations, such as hydrocarbon exploration, development, and/or production operations. For example, the simulation grid may be used for evaluating strategies to develop a reservoir and to extract hydrocarbons from the reservoir.

BACKGROUND

A geologic model is a computer-based three-dimensional ("3D") representation of a region beneath the earth's surface. Such models can be used to model a petroleum reservoir, a depositional basin, or other regions which may have valuable mineral resources. Once the model is constructed, it can be used for various purposes, many of which are intended to facilitate efficient and economical recovery of the valuable resources. For example, the geologic model may be used as an input to petroleum reservoir simulations, which are used to plan well placements and predict hydrocarbon production from a petroleum reservoir over time.

When performing reservoir simulations, geologic models are typically divided into a mesh of volumetric cells, i.e., volumetric elements having material properties values that are constant or otherwise well-defined within each cell. There is a tradeoff between the number and size of volumetric elements, with more numerous smaller elements typically providing higher accuracies at the cost of higher computational demands. A meshing strategy is considered desirable if it minimizes the computational burden for a given level of accuracy, without requiring an inordinate time to complete the gridding process. Various meshing strategies are known, but continuing improvements are sought.

SUMMARY

Accordingly, there are disclosed herein geologic modeling methods and systems employing an improved simulation meshing technique that executes quickly and provides better cell alignments. One or more embodiments of the geologic modeling method embodiment may comprise: obtaining a geologic model representing a faulted subsurface region in physical space; providing a set of background cells that encompass one or more partial faults within the subsurface region; defining a pseudo-extension from each unterminated edge of said one or more partial faults to a boundary of a corresponding background cell in said set; using the pseudo-extensions and the background cell boundaries to partition the subsurface region into sub-regions; deriving a simulation mesh in each sub-region; and outputting the simulation mesh. The simulation mesh may be suitable for use in one or more hydrocarbon operations, such as hydrocarbon exploration, development, or production operations. For example, the simulation mesh may be suitable for use in in evaluating fluid flow in the subsurface, such as fluid flow during one or more hydrocarbon production operations One or more geologic modeling systems described herein may comprise: a memory having geologic modeling software; and one or more processors coupled to the memory to execute the geologic modeling software. The software causes the one or more processors to perform operations that implement the geologic modeling method above.

One or more geologic modeling software products described herein may comprise a non-transitory information storage medium having computer readable program code embodied therein. When executed, the program code configures a computer to implement the geologic modeling method above.

Each of the foregoing embodiments may be employed individually or conjointly, and (as reflected by the claims) they may further employ one or more of the following features in any suitable combination. For example, in one or more embodiments said deriving may comprise selecting, as nodes, intersections of the partitioned horizons with edges of the pseudo-extensions. For example, in one or more embodiments said deriving may further comprise selecting, as nodes, intersections of the partitioned horizons with edges of the background cells in said set. For example, in one or more embodiments said deriving may further comprise connecting the nodes to define simulation mesh cells. For example, in one or more embodiments, said deriving may further comprise subdividing simulation mesh cells having a size above a threshold. For example, in one or more embodiments said deriving may further comprise moving nodes on the pseudo-extensions to reduce misalignment of simulation mesh cells. For example, in one or more embodiments said outputting may comprise storing the simulation mesh on a non-transitory information storage device. For example, in one or more embodiments, said outputting may comprise displaying a visual representation of the geologic model with the simulation mesh. For example, in one or more embodiments, the method may further comprise using the simulation mesh to evaluate one or more well placement and production strategies.

BRIEF DESCRIPTION OF THE DRAWINGS

The advantages of the present invention may be better understood by referring to the following detailed description and the attached drawings. It should be understood that the drawings and corresponding detailed description do not limit the disclosure, but on the contrary, they provide the foundation for understanding all modifications, equivalents, and alternatives falling within the scope of the appended claims.

FIG. 8 is a flow diagram of an illustrative subsurface modeling method.

NOMENCLATURE

Figure 1A:
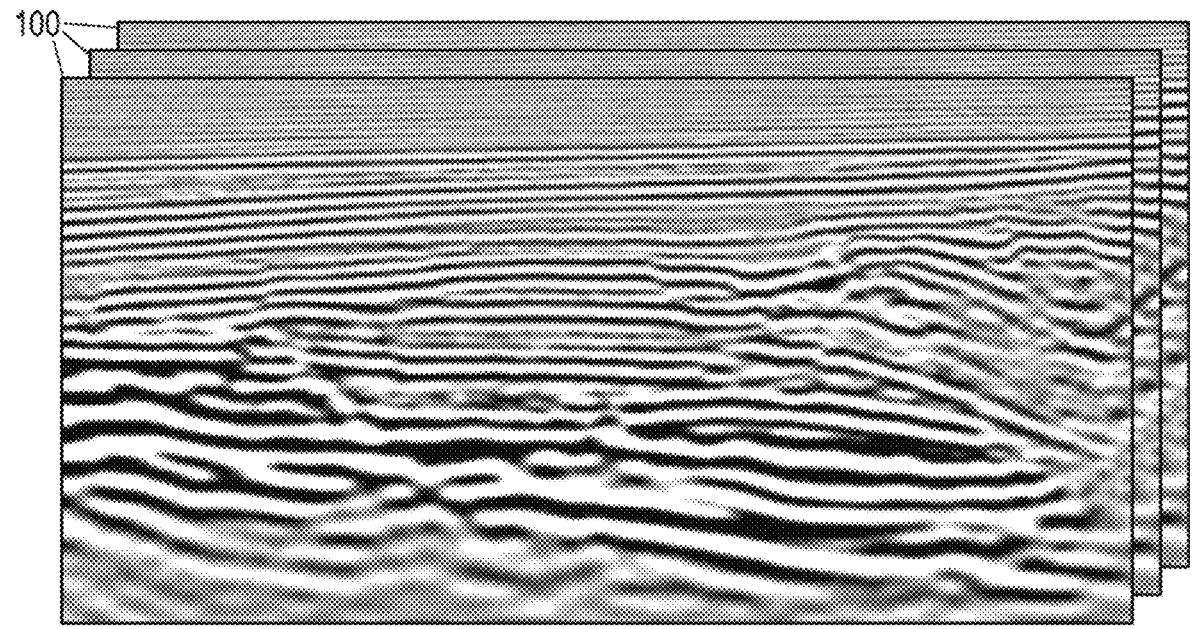
FIG. 1A shows an illustrative measured seismic image volume.

Various terms as used herein are defined herein. To the extent a term used in a claim is not defined herein, it should be given the broadest definition persons in the pertinent art have given that term as reflected in at least one printed publication or issued patent.

As used herein, the term "hydrocarbons" are generally defined as molecules formed primarily of carbon and hydrogen atoms. Hydrocarbons may also include other elements or compounds, such as, but not limited to, halogens, metallic elements, nitrogen, oxygen, sulfur, hydrogen sulfide (H2S), and carbon dioxide (CO2). Hydrocarbons may be located within or adjacent to mineral matrices within the earth (i.e., reservoirs) such as sedimentary rock, sands, silicilytes, carbonates, diatomites, and other porous media. Hydrocarbons may be produced from hydrocarbon reservoirs through wells penetrating a hydrocarbon containing formation. Hydrocarbons derived from a hydrocarbon reservoir may include, but are not limited to, petroleum, kerogen, bitumen, pyrobitumen, asphaltenes, tars, oils, natural gas, or combinations thereof.

As used herein, "hydrocarbon exploration" refers to any activity associated with determining the location of hydrocarbons in subsurface regions. Hydrocarbon exploration normally refers to any activity conducted to obtain measurements through acquisition of measured data associated with the subsurface formation and the associated modeling of the data to identify potential locations of hydrocarbon accumulations. Accordingly, hydrocarbon exploration includes acquiring measurement data, modeling of the measurement data to form subsurface models, and determining the likely locations for hydrocarbon reservoirs within the subsurface. The measurement data may include seismic data, gravity data, magnetic data, electromagnetic data, and the like.

As used herein, "hydrocarbon development" refers to any activity associated with planning of extraction and/or access to hydrocarbons in subsurface regions. Hydrocarbon development normally refers to any activity conducted to plan for access to and/or for production of hydrocarbons from the subsurface formation and the associated modeling of data to identify preferred development approaches and methods. By way of example, hydrocarbon development may include modeling of the subsurface formation and extraction planning for periods of production; determining and planning equipment to be utilized and techniques to be utilized in extracting the hydrocarbons from the subsurface formation; and the like.

As used herein, "hydrocarbon operations" refers to any activity associated with hydrocarbon exploration, hydrocarbon development and/or hydrocarbon production.

As used herein, "hydrocarbon production" refers to any activity associated with extracting hydrocarbons from subsurface location, such as a well or other opening. Hydrocarbon production normally refers to any activity conducted to form the wellbore along with any activity in or on the well after the well is completed. Accordingly, hydrocarbon production or extraction includes not only primary hydrocarbon extraction, but also secondary and tertiary production techniques, such as injection of gas or liquid for increasing drive pressure, mobilizing the hydrocarbon or treating by, for example chemicals or hydraulic fracturing the wellbore to promote increased flow, well servicing, well logging, and other well and wellbore treatments.

As used herein, "subsurface model" refers to a reservoir model, geomechanical model, watertight model, and/or a geologic model. The subsurface model may include subsurface data distributed within the model in two-dimensions (e.g., distributed into a plurality of cells, such as elements or blocks), three-dimensions (e.g., distributed into a plurality of voxels), or four or more dimensions.

As used herein, "watertight" means that a specific volume can be divided into one or more volume compartments with boundaries that have no holes and no overlaps with other boundaries. A watertight framework of faults and horizons divides a containing specified volume of interest into one or more volume compartments that have boundaries completely enclosing the compartments. Each fault and horizon is either a boundary of or contained within a volume compartment without any piece outside of a compartment.

As used herein, "surface" refers to geologic features, such as horizons and faults, as well as technical features, such as model boundary, concession boundary, or artificial compartment boundary. A horizon separates two packages of rock. A fault is a discontinuity of rock packages. Often, a fault exhibits displacement. An artificial compartment boundary may be used for accounting purposes.

As used herein, "watertight model" is a model (e.g., three-dimensional model) of the subsurface region having a mesh representing various objects (e.g., faults and/or horizons) and forming one or more watertight compartments.

As used herein, "geologic model" is a model (e.g., three-dimensional model) of the subsurface region having static properties and includes objects, such as faults and/or horizons, and properties, such as facies, lithology, porosity, permeability, or the proportion of sand and shale.

As used herein, "reservoir model" is a model (e.g., three-dimensional model) of the subsurface that in addition to static properties, such as porosity and permeability, also has dynamic properties that vary over the timescale of resource extraction, such as fluid composition, pressure, and relative permeability.

As used herein, "geomechanical model" is a model (e.g., three-dimensional model) of the subsurface that contain static properties, such as rock compressibility and Poisson's ratio, and model the mechanical response (e.g. compaction, subsidence, surface heaving, faulting, and seismic event) of the rock to fluid injection and extraction.

As used herein, "structural framework" or "framework" refer to a subsurface representation formed from objects (e.g., faults, horizons, other surfaces and model boundaries). For example, the framework is a subsurface representation that contains surfaces and polylines. A framework may be formed by surfaces of geologic, engineering, planning or other technical relevance.

As used herein, "mesh" or "grid" is a representation of a region of space (e.g., 2-D domain or 3-D domain), which may include objects, and includes two or more nodes and a set of polygons or polyhedra disposed within the region (e.g., a volumetric representation). The mesh may represent each object by a set of polygons or polyhedra disposed within the region. Properties may be assigned to some or all polygons.

As used herein, "simulate" or "simulation" is the process of performing one or more operations using a subsurface model and any associated properties to create simulation results. For example, a simulation may involve computing a prediction related to the resource extraction based on a reservoir model. A reservoir simulation may involve performing by execution of a reservoir-simulator computer program on a processor, which computes composition, pressure, or movement of fluid as function of time and space for a specified scenario of injection and production wells by solving a set of reservoir fluid flow equations. A geomechanical simulation may involve performing by execution of a geomechanical simulator computer program on a processor, which computes displacement, strain, stress, shear slip, energy release of the rock as a function of time and space in response to fluid extraction and injection.

DETAILED DESCRIPTION

Various specific embodiments, versions, and examples of the invention will now be described, including preferred embodiments and definitions that are adopted herein for purposes of understanding the claimed invention. While the following detailed description gives specific preferred embodiments, those skilled in the art will appreciate that these embodiments are exemplary only, and that the invention can be practiced in other ways. For purposes of determining infringement, the scope of the invention will refer to any one or more of the appended claims, including their equivalents, and elements or limitations that are equivalent to those that are recited. Any reference to the "invention" may refer to one or more, but not necessarily all, of the inventions defined by the claims.

FIG. 1A shows an illustrative measured seismic image volume 100, which can be expressed in many ways but is here shown as parallel slices of a three-dimensional volume. The measured image volume 100 is typically obtained by processing of field-recorded seismic survey traces representing seismic wave responses to shots or other sources of seismic energy triggered at an array of shot locations. The processing corrects for seismic wave travel times to determine reflective interface locations, and combines repeated measurements at each location to increase the signal to noise ratio. While seismic reflectivity is commonly employed, other seismic wave properties can also or alternatively be derived from the traces and used to construct the measured seismic image volume. One particular transformation is the inversion of the seismic data to estimate petrophysical parameters such as porosity, clay volume fraction, etc. that are often part of the geological model.

Figure 1B:
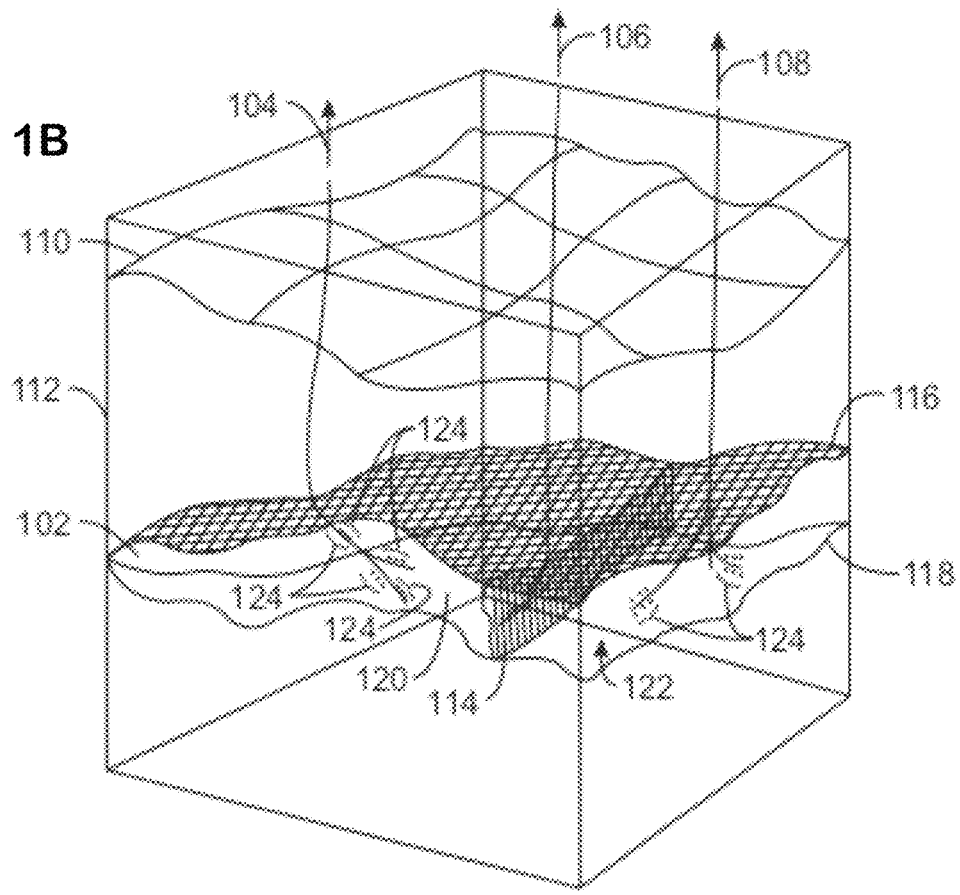
FIG. 1B shows an illustrative "watertight" subsurface model.

FIG. 1B shows an illustrative subsurface model having features that may be derived from a seismic image volume. The illustrative model includes a number of surfaces defining the boundaries of a potentially hydrocarbon-bearing formation 102 that may serve as a reservoir of oil or natural gas. The model facilitates placement and drilling of wells 104, 106, 108, from the Earth's surface 110 through layers of overburden 112 to access the formation 102. The illustrative model surfaces may include faults 114 and horizons 116, 118. The surfaces may intersect in a fashion that divides the reservoir formation 102 into distinct compartments 120, 122. The petrophysical parameters of each compartment may be estimated based on the seismic image data, measured using logging instruments in exploratory wells, and/or other methods known in the art.

Modern drilling techniques enable the wells 104, 106, 108 to deviate from the vertical orientation and to be directionally drilled to follow the reservoir 102. Further, the wells can be branched to increase the amount of wellbore contact with the reservoir, as shown for wells 104 and 108. The wells 104, 106, and 108, can have numerous areas with perforations 124, indicated as dots next to the wells, to provide a flow path for fluids, such as hydrocarbons, from the reservoir 102 into the wells 104, 106, and 108 for removal to the surface. If properly employed, such techniques may enable faster and more efficient extraction of reservoir fluids.

The locations and paths for the wells 104, 106, and 108, and the location of the perforations 124, may be optimized performing reservoir fluid flow simulations based on the subsurface model.

Subsurface models are often used as inputs to reservoir simulation programs that predict the behavior of fluids contained therein and may also predict the behavior of rocks under various scenarios of hydrocarbon recovery. Miscalculations or mistakes can be costly. For example, miscalculations may result in suboptimal locations for the wells 104, 106, and 108, potentially lacking any contact with the reservoir formation. Subsurface model based planning and simulation provide a mechanism to identify which recovery options offer more economic, efficient, and effective development plans for a particular reservoir.

More specifically, subsurface model construction begins with extraction of surfaces from a seismic image volume, including faults, horizons, and defining any additional surfaces such as boundaries for the region of interest. The different surfaces may be adjusted and trimmed to define closed volumes often called zones, compartments, or containers, such as zones 120 and 122. The surfaces may be represented using continuous functions, which facilitate moving or refining the surfaces to, e.g., test alternatives for resolving interpretation ambiguities. This ability to move and refine surfaces may lead to higher production by impacting the desired positioning of the wells 104, 106, and 108 or the perforations 124.

Figure 2A:
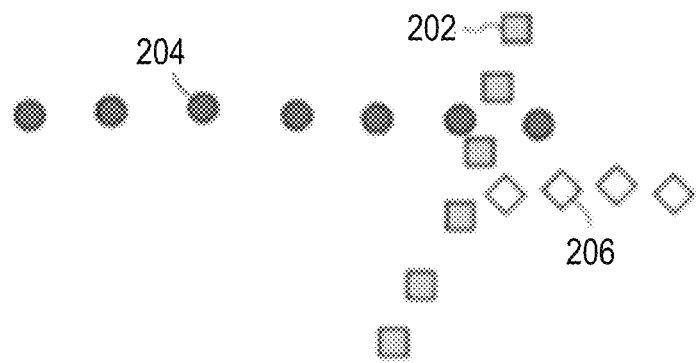
FIG. 2A shows identified features in an illustrative two-dimensional ("2D") model.
Figure 2B:
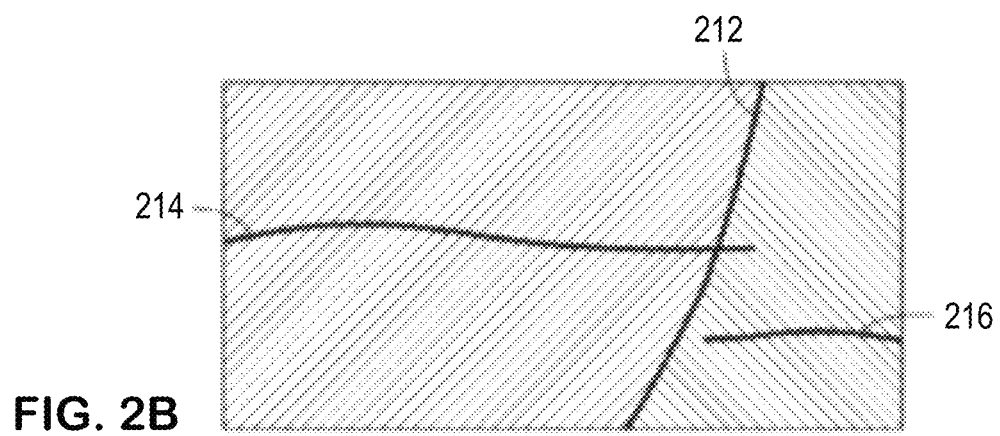
FIG. 2B shows extracted features of the 2D model.
Figure 2C:
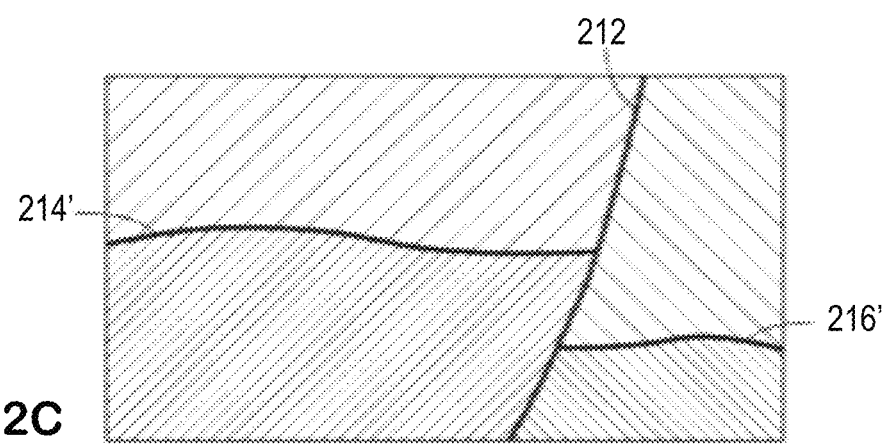
FIG. 2C shows a "watertight" version of the 2D model.

FIG. 2A shows (in two dimensions) an example of identified spatial correlations from a seismic image volume that combine to indicate the presence of three interfaces: a fault 202, a first patch of a horizon 204, and a second patch of the same horizon 206. Based on the identified correlations, FIG. 2B shows estimated positions for the fault surface 212 and the two horizon patches 214 and 216. While geophysics- and geologic-process-based expectations are for horizons to terminate at faults or intersections with other horizons, uncertainties in the feature extraction process may produce results inconsistent with expectations. For example, horizon 214 extends beyond the fault 212, while horizon 216 terminates short of fault 212. FIG. 2C shows how horizon 214 (from FIG. 2B) may be trimmed to form horizon 214' (in FIG. 2C) that terminates at fracture 212, while horizon 216 (from FIG. 2B) is extended to form horizon 216' (in FIG. 2C) that terminates at fracture 212, thereby forming four closed ("watertight") regions that satisfy the expectations for the physical structure of the subsurface region.

Thus, it is useful to employ surface representations that can be readily trimmed at intersections with other surfaces and/or extrapolated to intersect such other surfaces, as such representations facilitate the formation of watertight models consistent with expectations for physical structures, and further facilitate adjustments of surface locations to accommodate uncertainties in interpretation of the seismic data. Radial basis functions ("RBF") and level set functions ("LSF") are two such surface representation methods. The RBF representation method fits a weighted sum of basis functions to a set of nodes (aka points or vertices) on the represented surface, whereas the LSF representation method relies on a set of grid point values to create an implicit function that equals zero at every position on the surface. Though the nodes or grid points may be confined to a given region, the resulting functions can provide extrapolated values outside of that region such that, when an intersecting surface is shifted away, the extrapolated values may be used to fill in the gap. Conversely, the functions can also be trimmed as desired by shifting an intersection surface inward.

Figure 3A:
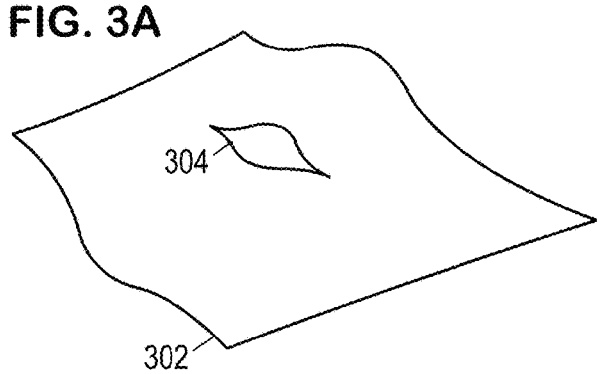
FIGS. 3A and 3B are perspective views of an illustrative horizon having a partial fault.
Figure 3B:
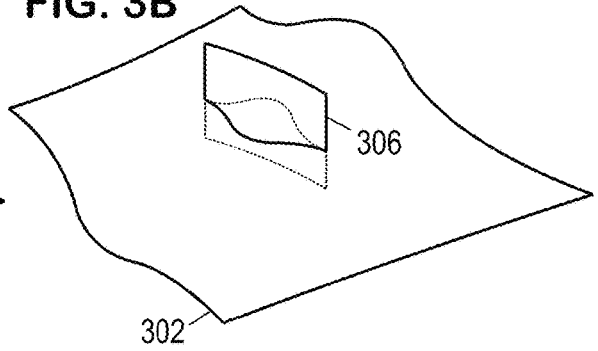

The foregoing surface representations facilitate modeling of continuous surfaces, but may face challenges when applied to surfaces having internal discontinuities. For example, FIGS. 3A and 3B show an illustrative horizon 302 having an internal discontinuity 304 along a partial fault 306. (As used herein, a "partial fault" is a fault that does not entirely divide a horizon into separate pieces.) Techniques for constructing such surface representations, with or without partial faults, are described in co-owned U.S. Patent Application No. 62/688,553, filed Jun. 22, 2018 and entitled "Methods and Systems for Modeling Subsurfaces Containing Partial Faults", the disclosure of which is hereby incorporated herein by reference.

As mentioned above, geologic models (including surface representations) are converted into a volumetric mesh for reservoir simulation. The conversion process should be fast, robust, and should avoid causing any accuracy or stability issues in the simulation process. (Such issues can arise from poor cell alignments that unduly magnify numbers of neighboring cells, and from large discrepancies in cell size.)

Figure 4:
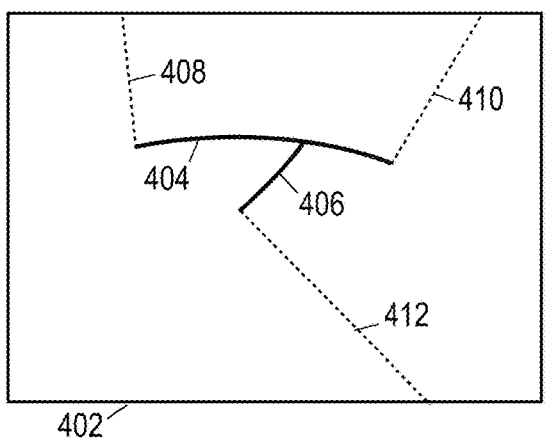
FIG. 4 is a plan view of an illustrative horizon with pseudo-extensions.

FIG. 4 is a plan view of a horizon 402 having a first partial fault 404 intersected by a second partial fault 406. When generating a mesh for simulation, one might consider "pseudo-extension", a process in which the ends of the partial faults are connected to the boundaries of the region of interest with pseudo-faults 408, 410, 412, thereby dividing the region of interest into sub-regions each having a single-valued horizon throughout. (The illustrated pseudo faults in FIG. 4 are extended at right angles to the partial fault planes, but this choice is arbitrary.) The sub-regions can then be independently meshed. However, when the sub-region meshes are later joined to form the full simulation mesh, there may exist an undesirable degree of misalignment across the pseudo-faults. Further, if the pseudo-fault approaches another fault or horizon at an acute angle, the pseudo-extension technique produces unnecessary discrepancies in cell sizes, creating additional algorithmic challenges that may not have a robust solution. Extra efforts would be need to ensure these artifacts do not cause problems in the flow simulation.

Figure 5:
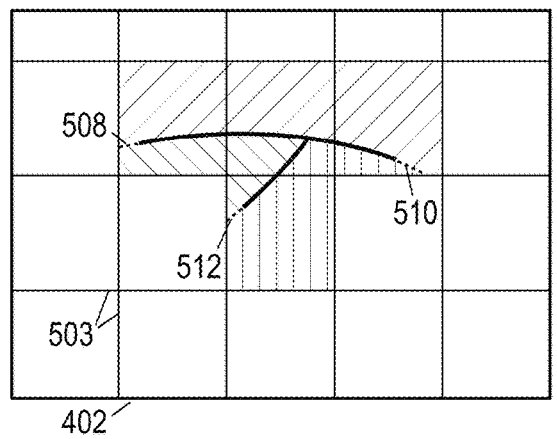
FIG. 5 is a plan views of the illustrative horizon with a background grid and partitioned sub-regions.

Accordingly, then, FIG. 5 is a plan view of the horizon 402, with a Cartesian background grid 503. While it is convenient for the background grid to be Cartesian, it is not a requirement. The background grid 503 may span the entire region of interest, or its span may be limited to encompassing the faults and horizons within the region of interest. The cell size for the background grid is preferably a small fraction of the region of interest.

The unterminated ends of the partial faults are pseudo-extended only within the cell of the background grid that contains the unterminated end. The pseudo-extensions terminate at the cell boundary. In FIG. 5, the pseudo-extensions 508, 510, 512, are extended tangential to the end of the partial fault, but this choice is arbitrary. As indicated by the cross-hatching the pseudo-extended faults partition their encompassing grid cells into separate sub-regions, each sub-region having a continuous portion of the horizon 402. The unhatched background cells also have a continuous portion of the horizon 402. To distinguish the unhatched sub-region from the hatched sub-regions, the former may be referred to herein as an "unfaulted sub-region" and the latter may be referred to as "faulted sub-regions". The unfaulted sub-region does not contain any faults and is bounded solely by the boundaries of background grid cells. Conversely, the faulted sub-regions are at least partly bounded by a fault or pseudo-extension of a fault.

Figure 6A:
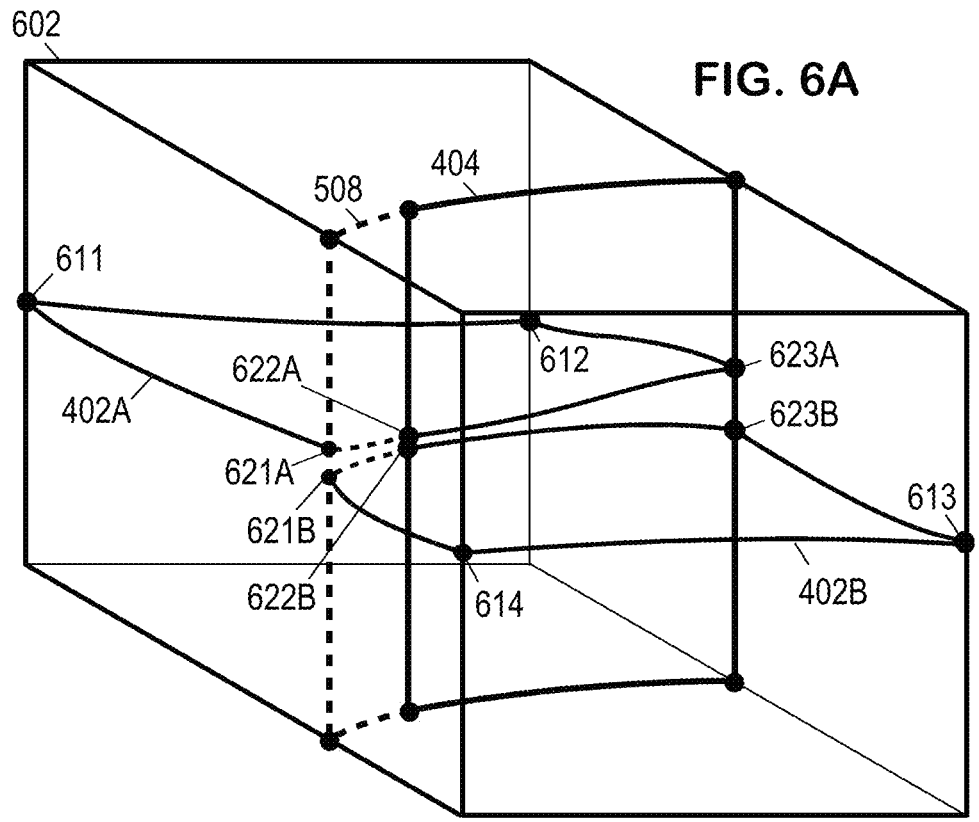
FIGS. 6A and 6B are perspective views of a background grid cell containing a portion of a partial fault edge.

Within each sub-region, the horizon 402 is processed to identify its intersections with the edges of the background cells. These intersections are "nodes" for potential use in defining the simulation mesh. For example, FIG. 6A is a perspective view of a background cell 602 containing a portion of a partial fault 404 and a pseudo-extension 508. (Depending on surface representation method and the manner in which the sub-region partitioning is performed, the surface representation for multiple horizon portions 402A, 402B may become discontinuous on the sub-region boundary.) Horizon portion 402A intersects the edges of the partitioned background cell (in this case, the vertical pillars of the partitioned grid) at nodes 611, 612, 621A, 622A, and 623A. Horizon portion 402B intersects the edges of the partitioned background cell at nodes 613, 614, 621B, 622B, and 623B. Any other horizons (and faults) in each sub-region are similarly processed to identify additional nodes for potential use in defining the simulation mesh. (The term "potential" is employed here because these nodes may be adjusted later.)

Where signed implicit functions are used to represent the horizon surfaces, it can be readily determined whether each surface intersects a line segment between any two given points, as a single such intersection would cause the sign of the function to be different at the two points. This characteristic enables root finder techniques (like bisection, the secant method, or regula falsi, among others) to be used for locating the surface's intersection with each background cell edge.

Once the intersection nodes are identified, an existing meshing algorithm is applied to each sub-region to capture the stratigraphic architecture within each zone. See, e.g., the technique described in Branets et al., "Capturing Geologic Complexity in a Simulation Grid", SPE-173270-MS, SPE Reservation Simulation Symposium, Houston, February 2015, the disclosure of which is incorporated herein by reference. The meshing algorithm connects the nodes to construct a volumetric mesh for the simulation. Where the simulation mesh cells are deemed to be too large, they may be subdivided with the introduction of new nodes where needed.

Figure 6B:
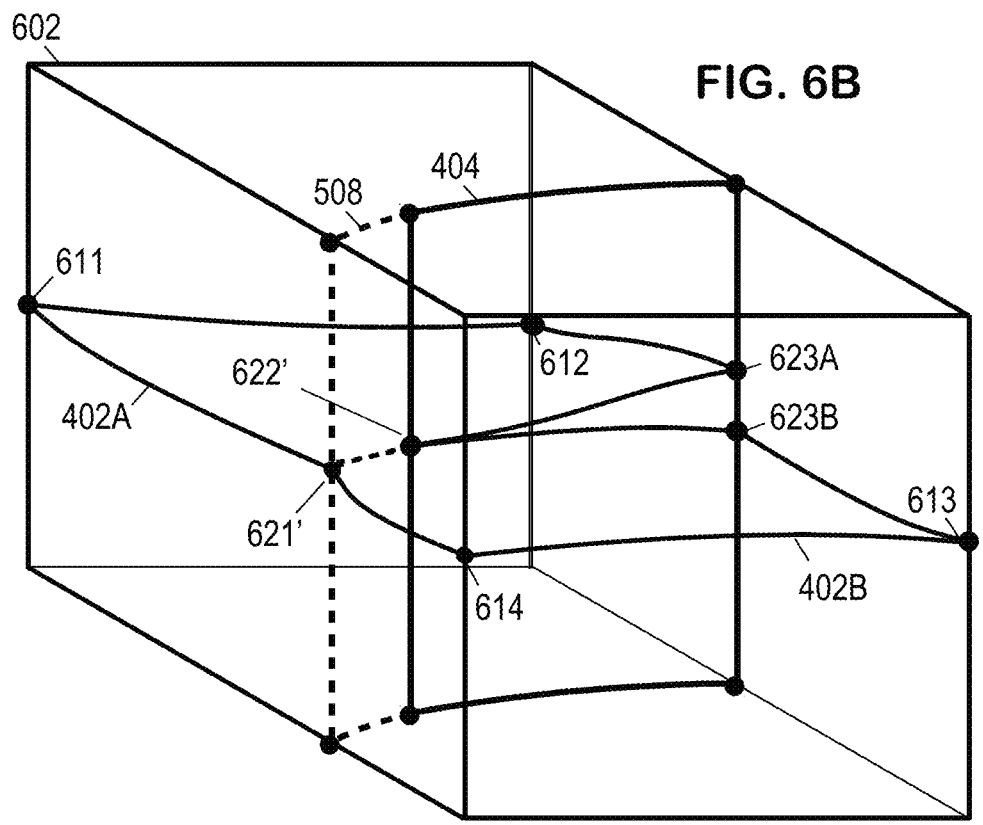

As previously mentioned, the horizons may become discontinuous across sub-region boundaries. Across faults, such discontinuities are expected. However, the discontinuities may be undesirable across pseudo-extensions and other sub-region boundaries. Accordingly, as shown in FIG. 6B, the nodes on pseudo-extensions (e.g., surface 508) and on sub-region boundaries may be merged to ensure mesh cell alignments. That is, in FIG. 6B nodes 621A and 621B (from FIG. 6A) have been merged into node 621' (in FIG. 6B) and nodes 622A and 622B (from FIG. 6A) have been merged into node 622' (in FIG. 6B).

The meshing process is followed by assignment of petrophysical parameter values to each cell and/or cell surface. Illustrative parameter values include transmissibility or flow rates between cells, rock type, porosity, permeability, oil saturation, groundwater saturation, gas saturation, clay content, and cementation. The assignment process may employ spatially-correlated reservoir properties and/or fluid properties, and may rely on wellbore measurements, rock type probability maps, and geostatistical distributions. Geostatistics may be used in subsurface models to interpolate observed data and to superimpose an expected degree of variability. Kriging is a suitable geostatistic technique, which uses the spatial correlation among data to construct the interpolation via semi-variograms. Repeated interpolations with different variograms, different seeds, different training images, etc., may be performed to assess spatial uncertainties.

Figure 7:
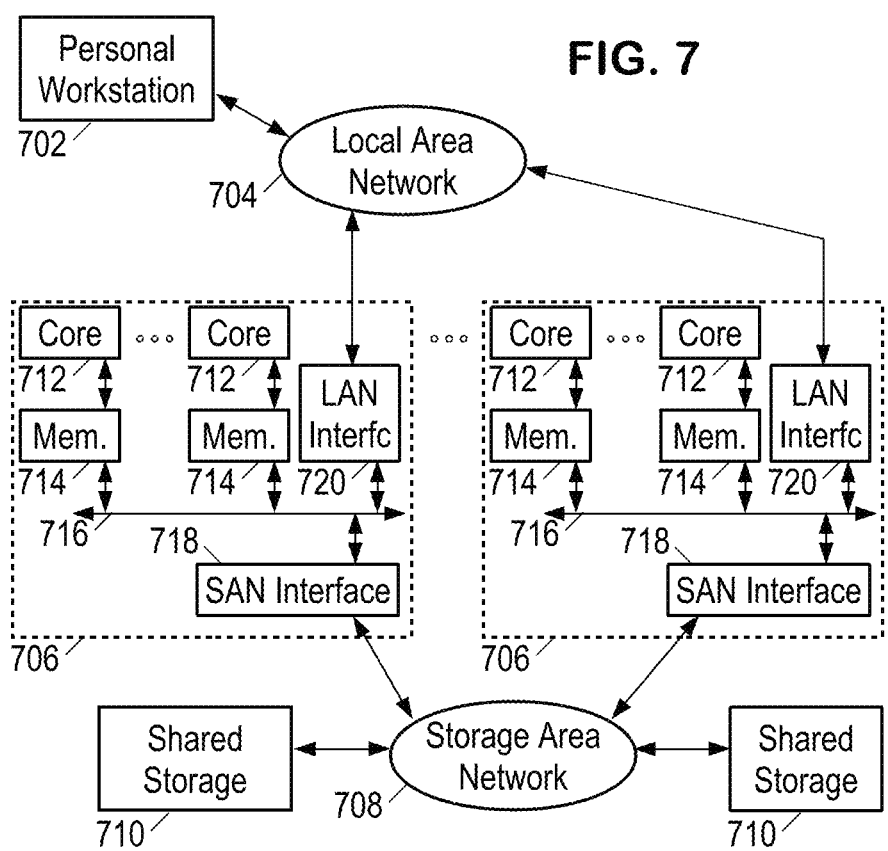
FIG. 7 is a block diagram of an illustrative subsurface modeling system.

FIG. 7 is a block diagram of an illustrative subsurface modeling system. The illustrative subsurface modeling system includes a personal workstation 702 coupled via a local area network (LAN) 704 to one or more multi-processor computers 706, which are in turn coupled via a storage area network (SAN) 708 to one or more shared storage units 710. Personal workstation 702 serves as a user interface to the subsurface modeling system, enabling a user to load data into the system, to configure and monitor the operation of the system, and to retrieve the results (often in the form of image data) from the system. Personal workstation 702 may take the form of a desktop computer with a display that graphically shows representations of the input and result data and with a keyboard that enables the user to move files and execute processing software. LAN 704 provides high-speed communication between multi-processor computers 706 and with personal workstation 702. The LAN 704 may take the form of an Ethernet network.

Multi-processor computer(s) 706 provide parallel processing capability to enable suitably prompt processing of the input data to derive the results data. Each computer 706 includes multiple processors 712, distributed memory 714, an internal bus 716, a SAN interface 718, and a LAN interface 720. Each processor 712 operates on allocated tasks to solve a portion of the overall problem and contribute to at least a portion of the overall results. Associated with each processor 712 is a distributed memory module 714 that stores application software and a working data set for the processors' use. Internal bus 716 provides inter-processor communication and communication to the SAN or LAN networks via the corresponding interfaces 718, 720. Communication between processors in different computers 706 can be provided by LAN 704.

SAN 708 provides high-speed access to shared storage devices 710. The SAN 708 may take the form of, e.g., a Fibrechannel or Infiniband network. Shared storage units 710 may be large, stand-alone information storage units that employ magnetic disk media for nonvolatile data storage. To improve data access speed and reliability, the shared storage units 710 may be configured as a redundant disk array ("RAID").

The processors 712 cooperatively execute subsurface modeling software stored in the distributed memory and/or on the shared storage units, which configures to processors to retrieve measurement data and stored model information from the shared storage units 710, operate on the retrieved data and information to implement the modeling methods and improvements disclosed herein, and to store the resulting subsurface models on the shared storage units 710 for future use. Such future use includes visualization methods to convey model information to users, simulation of reservoir fluid movements, and evaluation of well placement and production strategies, enabling users to select sites for drillers to direct boreholes, complete wells, and produce reservoir fluids in an efficient manner.

FIG. 8 is a flow diagram of an illustrative subsurface modeling method. It begins in block 802 with the system obtaining a seismic image volume. In block 804 the system automatically (or in response to user guidance) processes the image volume to extract horizons and faults. For the purposes of the present disclosure, at least one of the horizons is intersected by a partial fault. In block 806, the system derives a function-based representation for each of the surfaces. Preferably the surface representations are adjusted as needed to provide a watertight subsurface model.

In block 808, the system sets a background grid that spans the region of interest, encompassing the partial faults and any horizons intersected thereby. In block 810, the system pseudo-extends the unterminated edges of each partial fault to the boundary of the background cells containing the unterminated edges. In block 812, the pseudo-extended faults are used to partition the region of interest into sub-regions. In block 814, the system locates the intersections of the horizons with the partial faults and the edges of the background cells defining each sub-region. Starting with these intersection nodes, in block 816 the system derives a simulation mesh for each sub-region. In block 820, the system determines whether any horizon discontinuities exist across the sub-region boundaries (including the pseudo-extensions) and adjusts the mesh node locations as needed to align mesh cells across these boundaries. In block 822, the system assigns the petrophysical parameter values to each simulation mesh cell. In block 824, the system stores the model on non-transitory information storage devices. The subsurface model may also, optionally, be displayed or outputted and may further offer an interactive visualization of the subsurface model to a user. In block 826, the system configures the subsurface model in accordance with an identified production strategy, e.g., by specifying well locations and completion zones. In block 828 the system simulates production from the reservoir to evaluate the identified strategy. Blocks 826 and 828 may be repeated as needed to evaluate different strategies and refinements thereof. In block 830 the system displays the simulation results and may further offer an interactive visualization of the simulation and model to a user.

Though the operations shown and described in the flow diagram are treated as being sequential for explanatory purposes, in practice the method may be carried out by multiple processors operating concurrently and perhaps even speculatively to enable out-of-order operations. The ordering and sequential treatment is not meant to be limiting. These and numerous other modifications, equivalents, and alternatives, will become apparent to those skilled in the art once the above disclosure is fully appreciated. It is intended that the following claims be interpreted to embrace all such modifications, equivalents, and alternatives where applicable.

Embodiments of the present techniques also relate to an apparatus for performing the operations herein. This apparatus may be specially constructed for the required purposes, or it may comprise a general-purpose computer selectively activated or reconfigured by a computer program stored in the computer (e.g., one or more sets of instructions). Such a computer program may be stored in a computer readable medium. A computer-readable medium includes any mechanism for storing or transmitting information in a form readable by a machine (e.g., a computer). For example, but not limited to, a computer-readable (e.g., machine-readable) medium includes a machine (e.g., a computer) readable storage medium (e.g., read only memory ("ROM"), random access memory ("RAM"), magnetic disk storage media, optical storage media, flash memory devices, etc.).

Furthermore, as will be apparent to one of ordinary skill in the relevant art, the modules, features, attributes, methodologies, and other aspects of the present disclosure can be implemented as software, hardware, firmware or any combination of the three. Of course, wherever a component of the present disclosure is implemented as software, the component can be implemented as a standalone program, as part of a larger program, as a plurality of separate programs, as a statically or dynamically linked library, as a kernel loadable module, as a device driver, and/or in any other way known to those of skill in the art of computer programming. The software, hardware, or firmware embodying the disclosed methods may implement machine-readable logic, such that a set of instructions or code residing in memory, when executed, causes one or more processors to employ the other components of a computer system as needed to perform the disclosed methods.

What is claimed is:

1. A geologic modeling method that comprises:
obtaining a geologic model representing a faulted subsurface region in physical space;
providing a set of background cells that encompass one or more partial faults within the subsurface region;
defining a pseudo-extension from each unterminated edge of said one or more partial faults to a boundary of a corresponding background cell in said set, the unterminated end of said one or more partial faults being pseudo-extended only within the background cell that contains the unterminated end;
using the pseudo-extensions and the background cell boundaries to partition the subsurface region into sub-regions;
deriving a simulation mesh in each sub-region based on horizons in each sub-region; and
outputting the simulation mesh.

2. The method of claim 1, wherein said deriving includes:
selecting, as nodes, intersections of the horizons with edges of the pseudo-extensions.

3. The method of claim 2, wherein said deriving further includes:
selecting, as nodes, intersections of the horizons with edges of the background cells in said set.

4. The method of claim 2, wherein said deriving further includes:
connecting the nodes to define simulation mesh cells.

5. The method of claim 4, wherein said deriving further includes:
subdividing simulation mesh cells having a size above a threshold.

6. The method of claim 2, wherein said deriving further includes:
moving nodes on the pseudo-extensions to reduce misalignment of simulation mesh cells.

7. The method of claim 1, wherein said outputting includes:
storing the simulation mesh on a non-transitory information storage device; and displaying a visual representation of the geologic model with the simulation mesh.

8. The method of claim 1, further comprising:
using the simulation mesh to evaluate one or more well placement and production strategies.

9. A geologic modeling system that comprises:
a memory having geologic modeling software; and
one or more processors coupled to the memory to execute the geologic modeling software, the software causing the one or more processors to perform operations including:
obtaining a geologic model representing a faulted subsurface region in physical space;
providing a set of background cells that encompass one or more partial faults within the subsurface region;
defining a pseudo-extension from each unterminated edge of said one or more partial faults to a boundary of a corresponding background cell in said set, the unterminated end of said one or more partial faults being pseudo-extended only within the background cell that contains the unterminated end;
using the pseudo-extensions and the background cell boundaries to partition the subsurface region into sub-regions;
deriving a simulation mesh in each sub-region based on horizons in each sub-region; and
outputting the simulation mesh.

10. The system of claim 9, wherein said deriving includes:
selecting, as nodes, intersections of the horizons with edges of the pseudo-extensions.

11. The system of claim 10, wherein said deriving further includes:
selecting, as nodes, intersections of the horizons with edges of the background cells in said set.

12. The system of claim 10, wherein said deriving further includes:
connecting the nodes to define simulation mesh cells.

13. The system of claim 12, wherein said deriving further includes:
subdividing simulation mesh cells having a size above a threshold.

14. The system of claim 12, wherein said deriving further includes:
moving nodes on the pseudo-extensions to reduce misalignment of simulation mesh cells.

15. The system of claim 9, wherein said outputting includes:
storing the simulation mesh on a non-transitory information storage device; and displaying a visual representation of the geologic model with the simulation mesh.

16. The system of claim 9, wherein the operations further includes:
using the simulation mesh to evaluate one or more well placement and production strategies.

17. A non-transitory information storage product having computer readable program code embodied therein, which when executed configures a computer to implement a geological modeling method that comprises:
obtaining a geologic model representing a faulted subsurface region in physical space;
providing a set of background cells that encompass one or more partial faults within the subsurface region;
defining a pseudo-extension from each unterminated edge of said one or more partial faults to a boundary of a corresponding background cell in said set, the unterminated end of said one or more partial faults being pseudo-extended only within the background cell that contains the unterminated end;

using the pseudo-extensions and the background cell boundaries to partition the subsurface region into sub-regions;

deriving a simulation mesh in each sub-region based on horizons in each sub-region; and outputting the simulation mesh.

18. The product of claim 17, wherein said deriving includes:

selecting, as nodes, intersections of the horizons with edges of the pseudo-extensions.

19. The product of claim 18, wherein said deriving further includes:

connecting the nodes to define simulation mesh cells.

20. The product of claim 18, wherein said deriving further includes:

moving nodes on the pseudo-extensions to reduce misalignment of simulation mesh cells.

* * * * *